United States Patent
Lee

(10) Patent No.: US 12,279,532 B2
(45) Date of Patent: Apr. 15, 2025

(54) THERMOELECTRIC DEVICE

(71) Applicant: LG INNOTEK CO., LTD., Seoul (KR)

(72) Inventor: Un Hak Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/572,489

(22) PCT Filed: Jun. 22, 2022

(86) PCT No.: PCT/KR2022/008889
§ 371 (c)(1),
(2) Date: Dec. 20, 2023

(87) PCT Pub. No.: WO2022/270914
PCT Pub. Date: Dec. 29, 2022

(65) Prior Publication Data
US 2024/0292754 A1  Aug. 29, 2024

(30) Foreign Application Priority Data
Jun. 22, 2021  (KR) .................. 10-2021-0080900

(51) Int. Cl.
*H10N 10/17* (2023.01)
*H10N 10/13* (2023.01)
(Continued)

(52) U.S. Cl.
CPC ............. *H10N 10/17* (2023.02); *H10N 10/13* (2023.02); *H10N 19/00* (2023.02); *H10N 10/82* (2023.02)

(58) Field of Classification Search
CPC ......... H10N 10/17; H10N 19/00; H10N 10/13
See application file for complete search history.

(56) References Cited

U.S. PATENT DOCUMENTS

| | | | |
|---|---|---|---|
| 2015/0171302 A1* | 6/2015 | Himmer | H10N 10/13 136/205 |
| 2021/0167269 A1* | 6/2021 | Bong | H10N 10/13 |

FOREIGN PATENT DOCUMENTS

| | | |
|---|---|---|
| KR | 10-2016-0008858 | 1/2016 |
| KR | 10-2019-0097380 | 8/2019 |

(Continued)

OTHER PUBLICATIONS

International Search Report dated Sep. 23, 2022 issued in Application No. PCT/KR2022/008889.

*Primary Examiner* — Tae-Sik Kang
(74) *Attorney, Agent, or Firm* — KED & ASSOCIATES, LLP

(57) ABSTRACT

A thermoelectric device according to an embodiment of the present invention comprises: a fluid flow part including one surface and the other surface spaced apart from the one surface in a first direction; a first thermoelectric element arranged on one surface of the fluid flow part; and a second thermoelectric element arranged on the other surface of the fluid flow part. A first groove overlapping the first thermoelectric element in the first direction and a first hole not overlapping the first thermoelectric element in the first direction are arranged on one surface of the fluid flow part, wherein a depth of the first groove is less than a distance between the one surface and the other surface thereof, and the first hole penetrates from the one surface to the other surface thereof.

20 Claims, 13 Drawing Sheets

(51) Int. Cl.
   *H10N 19/00*   (2023.01)
   *H10N 10/82*   (2023.01)

(56) References Cited

FOREIGN PATENT DOCUMENTS

| KR | 10-2020-0109891 | 9/2020 |
| KR | 10-2021-0056224 | 5/2021 |
| KR | 10-2021-0069432 | 6/2021 |

* cited by examiner

THERMOELECTRIC DEVICE

CROSS-REFERENCE TO RELATED PATENT APPLICATIONS

This application is a U.S. National Stage Application under 35 U.S.C. § 371 of PCT Application No. PCT/KR2022/008889, filed Jun. 22, 2022, which claims priority to Korean Patent Application No. 10-2021-0080900, filed Jun. 22, 2021, whose entire disclosures are hereby incorporated by reference.

TECHNICAL FIELD

The present invention relates to a thermoelectric device, and more specifically, to a thermoelectric device using a temperature difference between a low-temperature part and a high-temperature part of the thermoelectric element.

BACKGROUND ART

A thermoelectric phenomenon is a phenomenon caused by the movement of electrons and holes inside a material and means direct energy conversion between heat and electricity.

A thermoelectric element is a general term for an element using the thermoelectric phenomenon and has a structure in which a P-type thermoelectric material and an N-type thermoelectric material are bonded between metal electrodes to form a pair of a PN junction.

The thermoelectric elements may be classified into elements using a temperature change in electrical resistance, elements using the Seebeck effect, which is a phenomenon in which an electromotive force is generated due to a temperature difference, elements using the Peltier effect, which is a phenomenon in which heat absorption or heat generation occurs due to a current, and the like.

The thermoelectric elements are widely applied to home appliances, electronic components, communication components, and the like. For example, the thermoelectric elements may be applied to cooling devices, heating devices, power generation devices, and the like. Therefore, the demand for the thermoelectric performance of the thermoelectric element is gradually increasing.

Recently, there is a need to generate electricity using high-temperature waste heat generated from engines of vehicles, vessels, and the like and the thermoelectric element. In this case, a fluid flow part through which a first fluid passes may be disposed at a low-temperature part side of the thermoelectric element, a heatsink may be disposed at a high-temperature part side of the thermoelectric element, and a second fluid with a higher temperature than the first fluid may pass through the heat sink. Therefore, electricity may be generated by a temperature difference between the low-temperature part and a high-temperature part of the thermoelectric element.

DISCLOSURE

Technical Problem

The present invention is directed to providing a thermoelectric device using a temperature difference between a low-temperature part and a high-temperature part of a thermoelectric element.

Technical Solution

A thermoelectric device according to an embodiment of the present invention includes a fluid flow part including one surface and the other surface spaced apart from the one surface in a first direction, a first thermoelectric element disposed on the one surface of the fluid flow part, and a second thermoelectric element disposed on the other surface of the fluid flow part, wherein a first groove overlapping the first thermoelectric element in the first direction and a first hole not overlapping the first thermoelectric element in the first direction are disposed in the one surface of the fluid flow part, a depth of the first groove is smaller than a distance between the one surface and the other surface, and the first hole passes through the fluid flow part from the one surface to the other surface.

The first thermoelectric element and the fluid flow part may be fixed by a first coupling member disposed in the first thermoelectric element and the first groove.

A fluid inlet of the fluid flow part may be disposed in one side surface between the one surface and the other surface, a fluid outlet of the fluid flow part may be disposed in the other side surface facing the one side surface between the one surface and the other surface, the fluid flow part may include a plurality of flow paths extending in a second direction from the one side surface to the other side surface, a flow path partition wall configured to partition the plurality of flow paths may be disposed between the plurality of flow paths, and the first groove may be disposed in the flow path partition wall.

The flow path partition wall may extend from a point spaced a predetermined distance from the one side surface toward the other side surface.

The thermoelectric device may further include a first connecting member disposed at the one side surface side of the fluid flow part and configured to transfer a fluid to the fluid inlet, and a second connecting member which is disposed at the other side surface side of the fluid flow part and through which the fluid discharged from the fluid outlet passes.

The one side surface may be disposed to be accommodated in the first connecting member, and the other side surface may be disposed to be accommodated in the second connecting member.

The first connecting member may include a first connecting hole disposed to face the other side surface of the fluid flow part, and a first connecting surface disposed at an edge of the first connecting hole, and the second connecting member may include a second connecting hole disposed to face the one side surface of the fluid flow part, and a second connecting surface disposed at an edge of the second connecting hole, the one side surface of the fluid flow part may be inserted into the first connecting hole, and the other side surface of the fluid flow part may be inserted into the second connecting hole.

The first connecting member and the second connecting member may each be welded to the fluid flow part.

A first welding part may be disposed along a boundary between the first connecting surface and the fluid flow part, and a second welding part may be disposed along a boundary between the second connecting surface and the fluid flow part.

A shortest distance between the one side surface of the fluid flow part and the flow path partition wall may be greater than a longest distance between the one side surface of the fluid flow part and the first welding part.

An inclined surface may be disposed between the one side surface and the one surface of the fluid flow part and between the one side surface and the other surface of the fluid flow part.

A second groove overlapping the second thermoelectric element in the first direction may be disposed on the other surface of the fluid flow part, and a depth of the second groove may be smaller than a distance between the one surface and the other surface.

A depth of each of the first groove and the second groove may be smaller than ½ times the distance between the one surface and the other surface.

The thermoelectric device may further include a shield member disposed on a surface of the fluid flow part, and the shield member and the fluid flow part may be fixed by a second coupling member disposed on the shield member and the first hole.

A second hole not overlapping the first thermoelectric element in the first direction may be further disposed in the one surface of the fluid flow part, the second hole may pass through the fluid flow part from the one surface to the other surface, and a size of the second hole may be greater than a size of the first hole.

A wire connected to at least one of the first thermoelectric element and the second thermoelectric element may pass through the second hole.

The thermoelectric device may further include a first heat sink disposed on the first thermoelectric element, and a second heat sink disposed on the second thermoelectric element.

Advantageous Effects

According to an embodiment of the present invention, it is possible to obtain a thermoelectric device that can have a simple structure, may be easy to assemble, and can accommodate the maximum number of thermoelectric elements in a predetermined space.

According to the embodiment of the present invention, it is possible to obtain a thermoelectric device with high thermoelectric performance by increasing a temperature difference between a high-temperature part and a low-temperature part.

The thermoelectric device according to the embodiment of the present invention may be applied to power generation devices for generating electricity using the temperature difference between the high-temperature part and the low-temperature part.

The thermoelectric device according to an embodiment of the present invention may be applied to a Peltier device for cooling or heating a specific object such as a fluid.

MODES OF THE INVENTION

Hereinafter, exemplary embodiments according to the present invention will be described in detail with reference to the accompanying drawings.

However, the technical spirit of the present disclosure is not limited to some of the described embodiments, but may be implemented in various different forms, and one or more of the components among the embodiments may be used by being selectively coupled or substituted without departing from the scope of the technical spirit of the present disclosure.

In addition, the terms (including technical and scientific terms) used in embodiments of the present invention may be construed as meaning that may be generally understood by those skilled in the art to which the present invention pertains unless explicitly specifically defined and described, and the meanings of the commonly used terms, such as terms defined in a dictionary, may be construed in consideration of contextual meanings of related technologies.

In addition, the terms used in the embodiments of the present invention are for describing the embodiments and are not intended to limit the present invention.

In the specification, a singular form may include a plural form unless otherwise specified in the phrase, and when described as "at least one (or one or more) of A, B, and C," one or more among all possible combinations of A, B, and C may be included.

In addition, terms such as first, second, A, B, (a), and (b) may be used to describe components of the embodiments of the present disclosure.

These terms are only for the purpose of distinguishing one component from another component, and the nature, sequence, order, or the like of the corresponding components is not limited by these terms.

In addition, when a first component is described as being "connected," "coupled," or "joined" to a second component, it may include a case in which the first component is directly connected, coupled, or joined to the second component, but also a case in which the first component is "connected," "coupled," or "joined" to the second component by other components present between the first component and the second component.

In addition, when a certain component is described as being formed or disposed on "on (above)" or "below (under)" another component, the terms "on (above)" or "below (under)" may include not only a case in which two components are in direct contact with each other, but also a case in which one or more other components are formed or disposed between the two components. In addition, when described as "on (above) or below (under)," it may include the meaning of not only an upward direction but also a downward direction based on one component.

Figure 1:
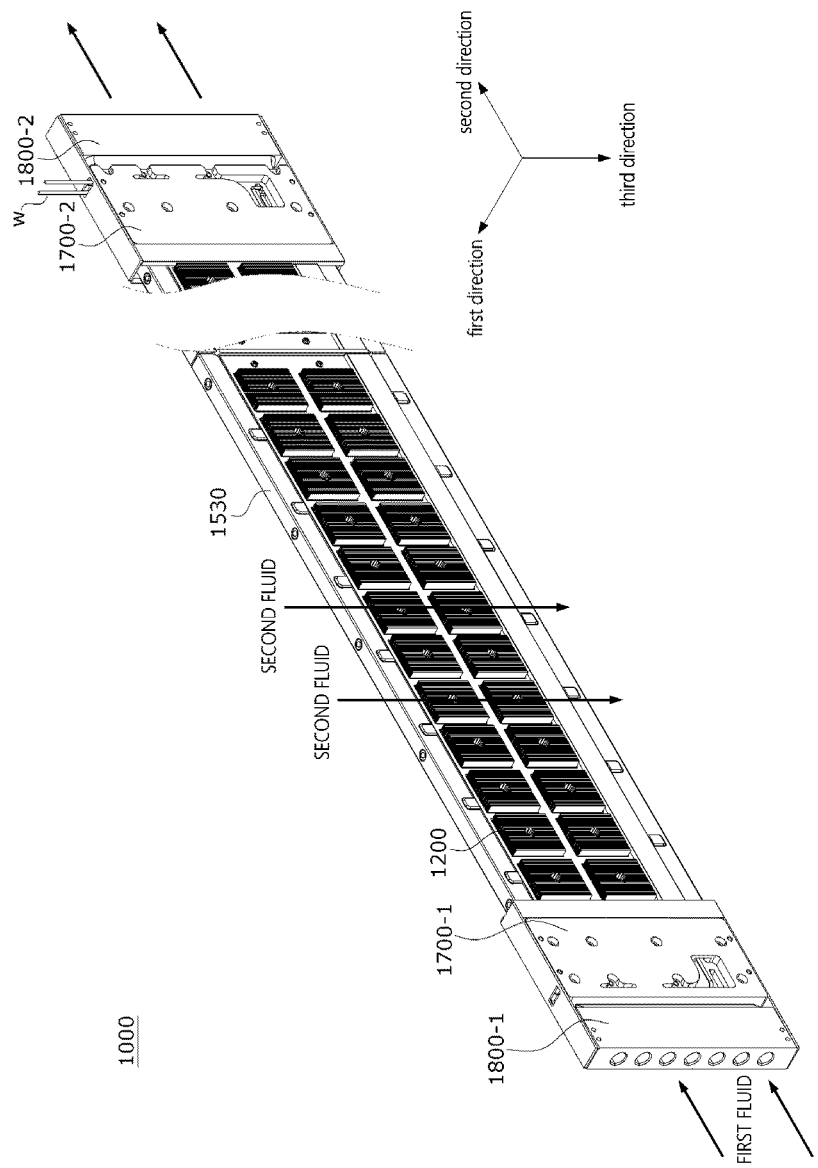
FIG. 1 is a perspective view of a thermoelectric device according to one embodiment of the present invention.
Figure 2:
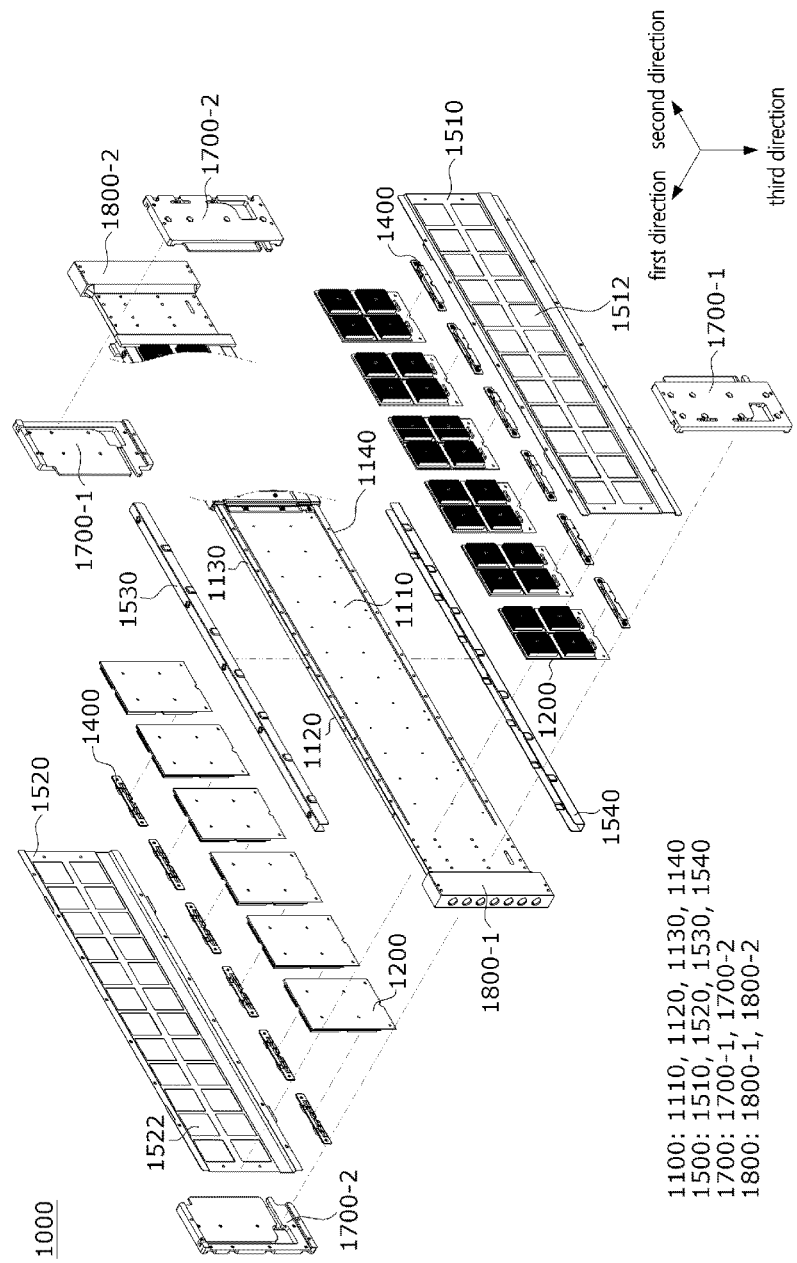
FIG. 2 is an exploded perspective view of the thermoelectric device according to one embodiment of the present invention.

FIG. 1 is a perspective view of a thermoelectric device according to one embodiment of the present invention, and FIG. 2 is an exploded perspective view of the thermoelectric device according to one embodiment of the present invention.

Referring to FIGS. 1 and 2, a thermoelectric device 1000 includes a fluid flow part 1100 and a thermoelectric module 1200 disposed on a surface of the fluid flow part 1100.

The thermoelectric device 1000 according to the embodiment of the present invention may generate power using a temperature difference between a first fluid flowing inside the fluid flow part 1100 and a second fluid flowing outside the fluid flow part 1100. A plurality of thermoelectric devices 1000 may be disposed in parallel to be spaced predetermined distances from each other to form a power generation system.

The first fluid flowing into the fluid flow part 1100 may be water, but is not limited thereto and may be various types of fluids with cooling performance. A temperature of the first fluid flowing into the fluid flow part 1100 may be lower than 100° C., preferably, lower than 50° C., and more preferably, lower than 40° C., but is not limited thereto and may be a fluid with a lower temperature than the second fluid. A temperature of the first fluid discharged after passing through the fluid flow part 1100 may be higher than the temperature of the first fluid flowing into the fluid flow part 1100.

According to the embodiment of the present invention, a plurality of thermoelectric modules 1200 may be disposed on a first surface 1110 and a second surface 1120 facing the first surface 1110 of the fluid flow part 1100. The first fluid may flow from one side surface between the first surface 1110 and the second surface 1120 toward the other side surface facing the one side surface between the first surface 1110 and the second surface 1120. To this end, a fluid inlet may be disposed in the one side surface, and a fluid outlet may be disposed in the other side surface. The second fluid may flow from a third surface 1130, which is an upper surface between the first surface 1110 and the second surface 1120, toward a fourth surface 1140, which is a lower surface between the first surface 1110 and the second surface 1120. For convenience of description, in the specification, a direction from the first surface 1110 to the second surface 1120 may be referred to as a first direction, a direction in which the first fluid flows may be referred to as a second direction, and a direction in which the second fluid flows may be referred to as a third direction, but the present invention is not limited thereto.

In order to facilitate the introduction and discharge of the first fluid and support the fluid flow part 1100, a first connecting member 1800-1 and a second connecting member 1800-2 may be installed at the fluid inlet side and the fluid outlet side of the fluid flow part 1100, respectively. In the specification, the first connecting member 1800-1 and the second connecting member 1800-2 may be used interchangeably with the first tube expanding member 1800-1 and the second tube expanding member 1800-2, respectively. Alternatively, in the specification, the first connecting member 1800-1 and the second connecting member 1800-2 may be used interchangeably with the first tube expanding block 1800-1 and the second tube expanding block 1800-2, respectively.

Meanwhile, the second fluid passes through the outside of the thermoelectric module 1200, for example, a heat sink disposed outside the fluid flow part 1100. The second fluid may be waste heat generated from engines of vehicles, vessels, and the like, but is not limited thereto. For example, a temperature of the second fluid may be 100° C. or higher, preferably, 200° C. or higher, and more preferably, 220 to 250° C., but is not limited thereto and may be a fluid with a higher temperature than the first fluid.

In the specification, an example in which a temperature of the first fluid flowing through the inside of the fluid flow part 1100 is lower than the temperature of the second fluid passing through the heat sink of the thermoelectric module 1200 disposed outside the fluid flow part 1100 will be described. Therefore, in the specification, the fluid flow part 1100 may be referred to as a duct or a cooling part. However, the embodiment of the present invention is not limited thereto, and the temperature of the first fluid flowing through the inside of the fluid flow part 1100 may be higher than the temperature of the second fluid passing through the heat sink of the thermoelectric module 1200 disposed outside the fluid flow part 1100.

According to the embodiment of the present invention, the thermoelectric module 1200 includes a thermoelectric element and the heat sink disposed on the thermoelectric element. The thermoelectric element according to the embodiment of the present invention may have a structure of a thermoelectric element 100 illustrated in FIGS. 3 and 4.

Figure 3:
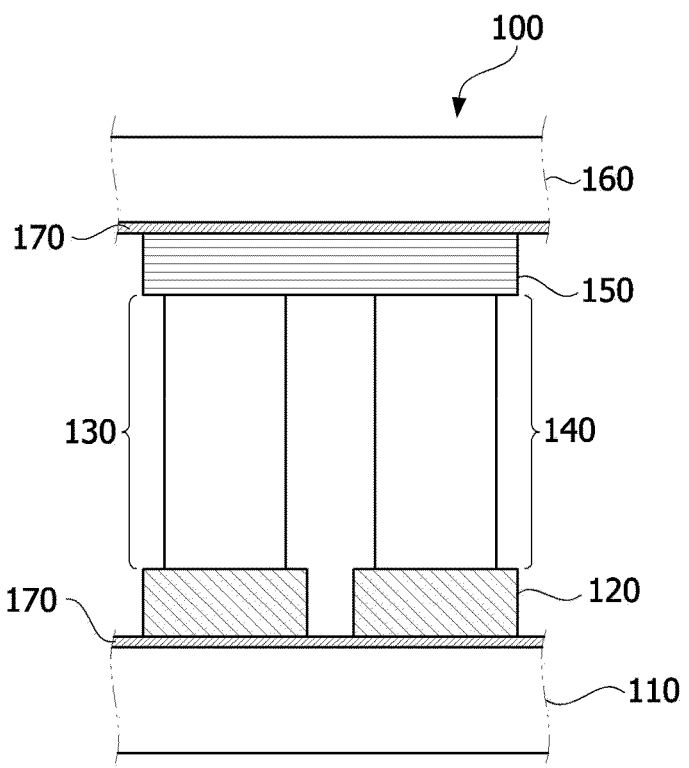
FIG. 3 is a cross-sectional view of a thermoelectric element according to one embodiment of the present invention.
Figure 4:
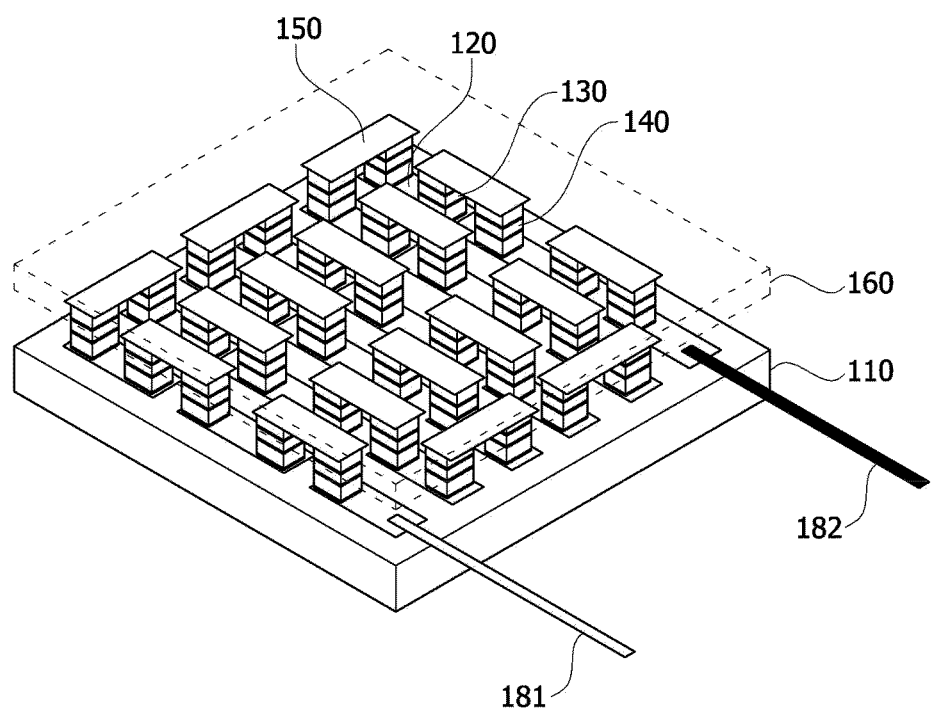
FIG. 4 is a perspective view of the thermoelectric element according to one embodiment of the present invention.

Referring to FIGS. 3 and 4, the thermoelectric element 100 includes a first substrate 110, a first electrode 120, a P-type thermoelectric leg 130, an N-type thermoelectric leg 140, a second electrode 150, and a second substrate 160.

The first electrode 120 is disposed between the first substrate 110 and lower bottom surfaces of the P-type thermoelectric leg 130 and the N-type thermoelectric leg 140, and the second electrode 150 is disposed between the second substrate 160 and upper bottom surfaces of the P-type thermoelectric leg 130 and the N-type thermoelectric leg 140. Therefore, the plurality of P-type thermoelectric legs 130 and the plurality of N-type thermoelectric legs 140 are electrically connected by the first electrodes 120 and the second electrodes 150. A pair of P-type thermoelectric legs 130 and N-type thermoelectric legs 140 disposed between the first electrode 120 and the second electrode 150 and electrically connected may form a unit cell.

For example, when a voltage is applied to the first electrode 120 and the second electrode 150 through lead wires 181 and 182, due to the Peltier effect, a substrate in which a current flows from the P-type thermoelectric leg 130 to the N-type thermoelectric leg 140 may absorb heat to function as a cooling part, and a substrate in which a current flows from the N-type thermoelectric leg 140 to the P-type thermoelectric leg 130 may be heated to function as a heating part. Alternatively, when the temperature difference between the first electrode 120 and the second electrode 150 is applied, charges in the P-type thermoelectric leg 130 and the N-type thermoelectric leg 140 may be moved due to the Seebeck effect to generate electricity.

Here, the P-type thermoelectric leg 130 and the N-type thermoelectric leg 140 may be bismuth telluride (Bi—Te)-based thermoelectric legs containing bismuth (Bi) and tellurium (Te) as main raw materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain Bi—Sb—Te, which is the main raw material at 99 to 99.999 wt %, based on 100 wt % of the total weight and contain at least one of nickel (Ni), aluminum (Al), copper (Cu), silver (Ag), lead (Pb), boron (B), gallium (Ga), and indium (In) at 0.001 to 1 wt %. The N-type thermoelectric leg 140 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain Bi—Sb—Te, which is the main raw material at 99 to 99.999 wt %, based on 100 wt % of the total weight and contain at least one of nickel (Ni), aluminum (Al), copper (Cu), silver (Ag), lead (Pb), boron (B), gallium (Ga), and indium (In) at 0.001 to 1 wt %.

The P-type thermoelectric leg 130 and the N-type thermoelectric leg 140 may be formed in a bulk type or a stack type. In general, the bulk-type P-type thermoelectric leg 130 or the bulk-type N-type thermoelectric leg 140 may be obtained through a process of manufacturing an ingot through thermal treatment for a thermoelectric material, crushing and sieving the ingot to acquire powder for the thermoelectric leg, then sintering the powder, and cutting a sintered body. In this case, the P-type thermoelectric leg 130 and the N-type thermoelectric leg 140 may be polycrystalline thermoelectric legs. As described above, when the P-type thermoelectric leg 130 and the N-type thermoelectric leg 140 are the polycrystalline thermoelectric legs, strengths of the P-type thermoelectric leg 130 and the N-type thermoelectric leg 140 may be increased. The stack-type P-type thermoelectric leg 130 or the stack-type N-type thermoelectric leg 140 may be obtained through a process of coating a sheet-shaped base with a paste containing a thermoelectric material to form a unit member, and then stacking and cutting the unit members.

In this case, the pair of P-type thermoelectric legs 130 and N-type thermoelectric legs 140 may have the same shape and volume or have different shapes and volumes. For example, since the electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal pillar shape, an oval pillar shape, or the like.

In the specification, the thermoelectric leg may be referred to as a thermoelectric structure, a semiconductor element, a semiconductor structure, or the like.

The performance of the thermoelectric element according to one embodiment of the present invention may be expressed as a thermoelectric figure of merit (ZT). The ZT can be expressed as in Equation 1.

$$ZT = \alpha^2 \cdot \sigma \cdot T/k \qquad \text{[Equation 1]}$$

Here, α denotes a Seebeck coefficient [V/K], σ denotes an electrical conductivity [S/m], and $\alpha^2\sigma$ denotes a power factor [W/mK$^2$]. In addition, T denotes a temperature, and k denotes a thermal conductivity [W/mK]. k can be expressed as a·cp·ρ, in which a denotes a thermal diffusivity [cm$^2$/S], cp denotes a specific heat [J/gK], and ρ denotes a density [g/cm$^3$].

In order to obtain a thermoelectric performance index of the thermoelectric element, a Z value (V/K) may be measured using a Z meter, and the ZT may be calculated using the measured Z value.

Here, the first electrode 120 disposed between the first substrate 110 and the P-type thermoelectric leg 130 and the N-type thermoelectric leg 140, and the second electrode 150 disposed between the second substrate 160 and the P-type thermoelectric leg 130 and the N-type thermoelectric leg 140 may contain at least one of copper (Cu), silver (Ag), aluminum (Al), and nickel (Ni) and have a thickness of 0.01 to 0.3 mm. When a thickness of the first electrode 120 or the second electrode 150 is smaller than 0.01 mm, a function as an electrode may be degraded, thereby reducing the electrical conduction performance, and when the thickness exceeds 0.3 mm, the electrical conduction efficiency can be reduced due to an increase in resistance.

In addition, the first substrate 110 and the second substrate 160 facing each other may be metal substrates, and thicknesses thereof may be in a range of 0.1 to 1.5 mm. When the thickness of the metal substrate is smaller than 0.1 mm or more than 1.5 mm, the heat radiation characteristics or thermal conductivity may be excessively high, thereby reducing the reliability of the thermoelectric element. In addition, when the first substrate 110 and the second substrate 160 are metal substrates, an insulating layer 170 may be further formed between the first substrate 110 and the first electrode 120 and between the second substrate 160 and the second electrode 150. The insulating layer 170 may contain a material with a thermal conductivity of 1 to 20 W/mK. In this case, the insulating layer 170 may be a layer made of a resin composition containing at least one of an epoxy resin and silicone resin and an inorganic material or a silicone composite containing silicone and an inorganic material. Here, the inorganic material may be at least one of an oxide, a nitride, and a carbide such as aluminum, boron, and silicon.

In this case, the first substrate 110 and the second substrate 160 may be formed to have different sizes. In other words, a volume, thickness, or area of one of the first substrate 110 and the second substrate 160 may be formed to be greater than a volume, thickness, or area of the other one. Here, the thickness may be a thickness in a direction from the first substrate 110 to the second substrate 160, and the area may be an area in a direction perpendicular to a direction from the first substrate 110 to the second substrate 160. Therefore, it is possible to enhance the heat absorption or heat radiation performance of the thermoelectric element. Preferably, the volume, thickness, or area of the first substrate 110 may be formed to be greater than at least one of the volume, thickness, or area of the second substrate 160. In this case, when the first substrate 110 is disposed in a high-temperature area for the Seebeck effect, when the first substrate 110 is applied as a heating area for the Peltier effect, or when a sealing member for protecting the first substrate 110 from an external environment of the thermoelectric element, which will be described below, is disposed on the first substrate 110, at least one of the volume, the thickness, and the area of the first substrate may become greater than the second substrate 160. In this case, the area of the first substrate 110 may be in a range of 1.2 to 5 times the area of the second substrate 160. When the area of the first substrate 110 is formed to be smaller than 1.2 times that of the second substrate 160, the influence on improving thermal transfer efficiency is not high, and when the area of the first substrate 110 exceeds 5 times, the thermal transfer efficiency may be rather reduced significantly, thereby making it difficult to maintain a basic shape of the thermoelectric module.

In addition, a heat radiation pattern, for example, an uneven pattern may be formed on a surface of at least one of the first substrate 110 and the second substrate 160. Therefore, it is possible to enhance the heat radiation performance of the thermoelectric element. When the uneven pattern is formed on the surface in contact with the P-type thermoelectric leg 130 or the N-type thermoelectric leg 140, it is possible to improve the bonding characteristics between the thermoelectric leg and the substrate.

Although not illustrated, a sealing member may be further disposed between the first substrate 110 and the second substrate 160. The sealing member may be disposed on side surfaces of the first electrode 120, the P-type thermoelectric leg 130, the N-type thermoelectric leg 140, and the second electrode 150 between the first substrate 110 and the second substrate 160. Therefore, the first electrode 120, the P-type thermoelectric leg 130, the N-type thermoelectric leg 140, and the second electrode 150 may be shielded from external moisture, heat, contamination, and the like.

Referring back to FIGS. 1 and 2, the plurality of thermoelectric modules 1200 may be disposed on the first surface 1110 and the second surface 1120 of the fluid flow part 1100.

As described above, each thermoelectric element includes the first substrate 110 disposed in contact with the fluid flow part 1100, the plurality of first electrodes 120 disposed on the first substrate 110, the plurality of thermoelectric legs 130 and 140 disposed on the plurality of first electrodes 120, the plurality of second electrodes 150 disposed on the plurality of thermoelectric legs 130 and 140, and the plurality of second electrodes 150, and the heat sink is disposed on the second substrate 160. In this case, the first substrate of the thermoelectric element disposed on the fluid flow part 1100 may be a metal substrate, and the metal substrate may be attached to the surface of the fluid flow part 1100 by a thermal interface material (TIM) (not illustrated). Since the metal substrate has excellent thermal transfer performance, thermal transfer between the thermoelectric element and the fluid flow part 1100 is easy. In addition, when the metal substrate and the fluid flow part 1100 are bonded by the TIM, the thermal transfer between the metal substrate and the fluid flow part 1100 may not be hindered. Here, the metal substrate may be one of a copper substrate, an aluminum substrate, and a copper-aluminum substrate, but is not limited thereto.

Each of the plurality of thermoelectric modules 1200 may include a connector part for extracting generated electricity to the outside or applying the electricity to be used as a Peltier device. According to the embodiment of the present invention, by arranging a support member 1400 around the connector part, it is possible to uniformly maintain a bonding strength between the thermoelectric module 1200 and the fluid flow part 1100 and protect a wire W connected to the connector part.

In addition, according to the embodiment of the present invention, a shield member 1500 may be further disposed to prevent moisture or contaminants from flowing into the plurality of thermoelectric modules 1200. The shield member 1500 may include a first shield member 1510 disposed on the first surface 1110 of the fluid flow part 1100 and a second shield member 1520 disposed on the second surface 1120 of the fluid flow part 1100. The first shield member 1510 and the second shield member 1520 may each be disposed on the second substrate of the thermoelectric element. In this case, in order for the second fluid to pass through the heat sink, through holes 1512 and 1522 may be formed in the first shield member 1510 and the second shield member 1520, respectively, and edges of the through holes 1512 and 1522 may be disposed in the second substrate of the thermoelectric element so that the heat sink may be exposed through the through holes 1512 and 1522. Therefore, it is possible to protect the inside of the thermoelectric element from external contaminants, moisture, and the second fluid and allow the second fluid to directly pass through the heat sink, thereby efficiently performing the heat exchange between the second fluid and the heat sink. According to one embodiment of the present invention, the shield member 1500 may further include a third shield member 1530 disposed on the third surface 1130 of the fluid flow part 1100 and a fourth shield member 1540 disposed at the fourth surface 1140 of the fluid flow part 1100. Since the second fluid may flow in a direction from the third surface 1130 to the fourth surface 1140 of the fluid flow part 1100, an insulating member may be further disposed between the third surface 1130 of the fluid flow part 1100 and the third shield member 1530 and between the fourth surface 1140 and the fourth shield member 1540. Therefore, since the first fluid flowing inside the fluid flow part 1100 and the second fluid flowing outside the fluid flow part 1100 are insulated, it is possible to enhance the thermoelectric performance of the thermoelectric element.

Meanwhile, according to the embodiment of the present invention, a guide member 1700 may be further disposed on the first surface 1110 and the second surface 1120 of the fluid flow part 1100. The guide member 1700 may function to guide the wire connected to the thermoelectric module 1200 to the outside. The guide member 1700 may be disposed on a side surface of the thermoelectric module 1200 on each of the first surface 1110 and the second surface 1120 of the fluid flow part 1100.

Figure 5:
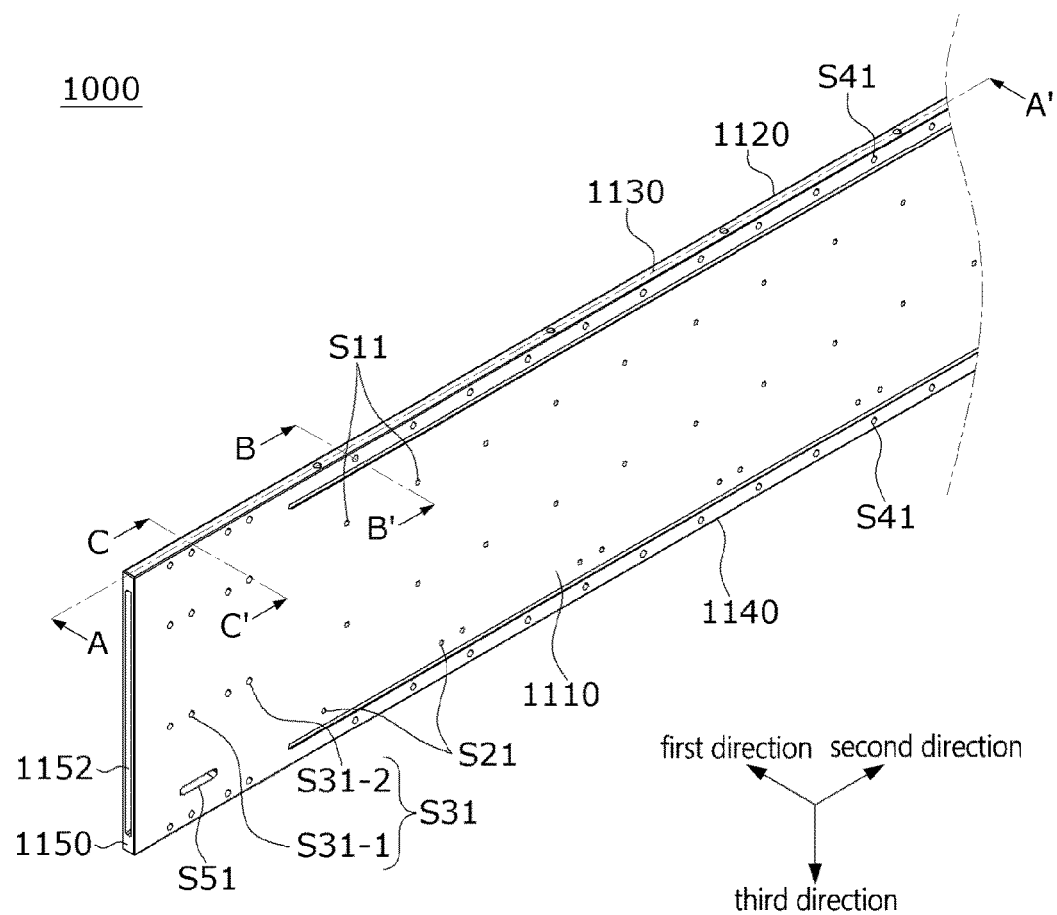
FIG. 5 is a perspective view of one surface of a fluid flow part included in the thermoelectric device according to one embodiment of the present invention.
Figure 6:
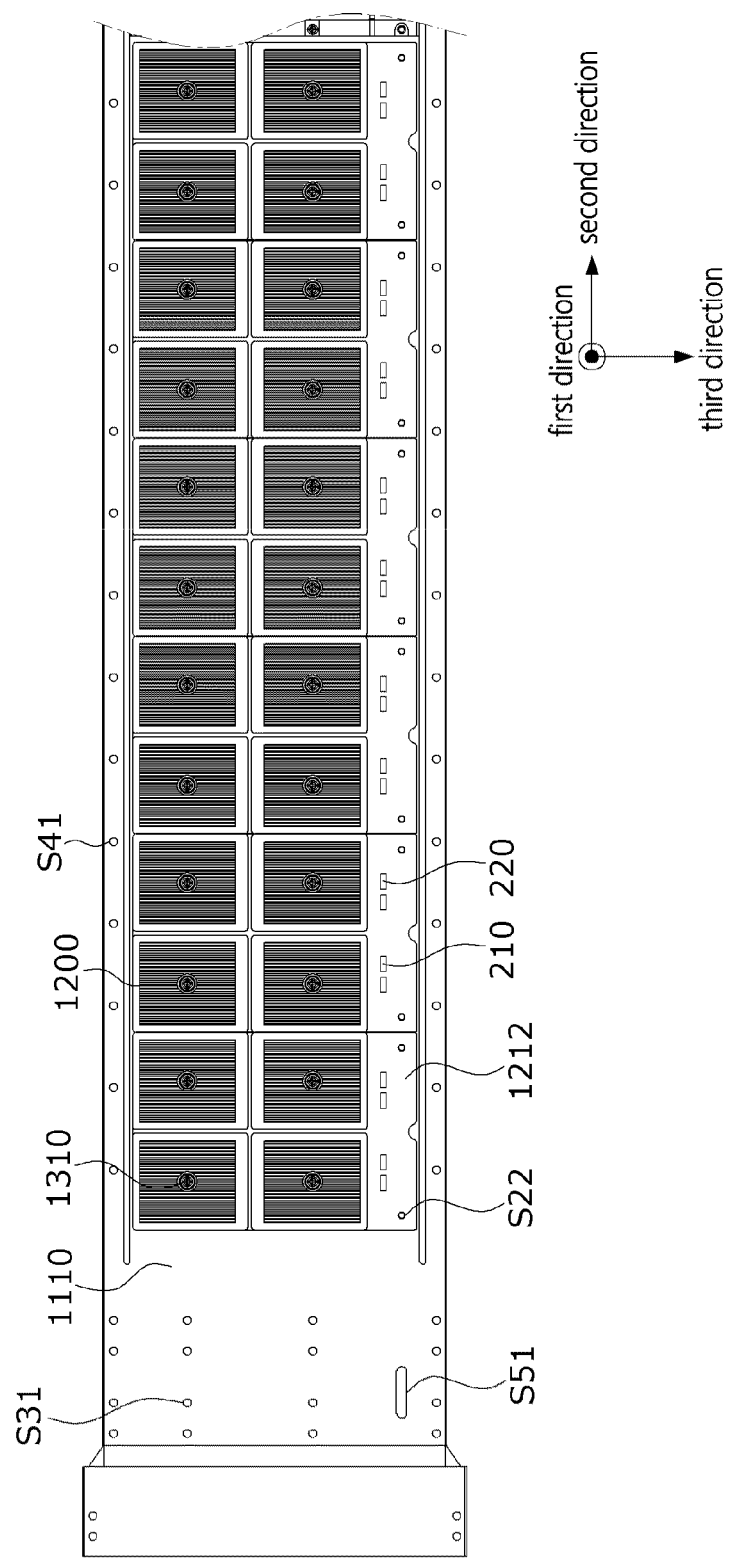
FIG. 6 is a front view of a plurality of thermoelectric modules disposed on one surface of a fluid flow part included in the thermoelectric device according to one embodiment of the present invention.
Figure 7:
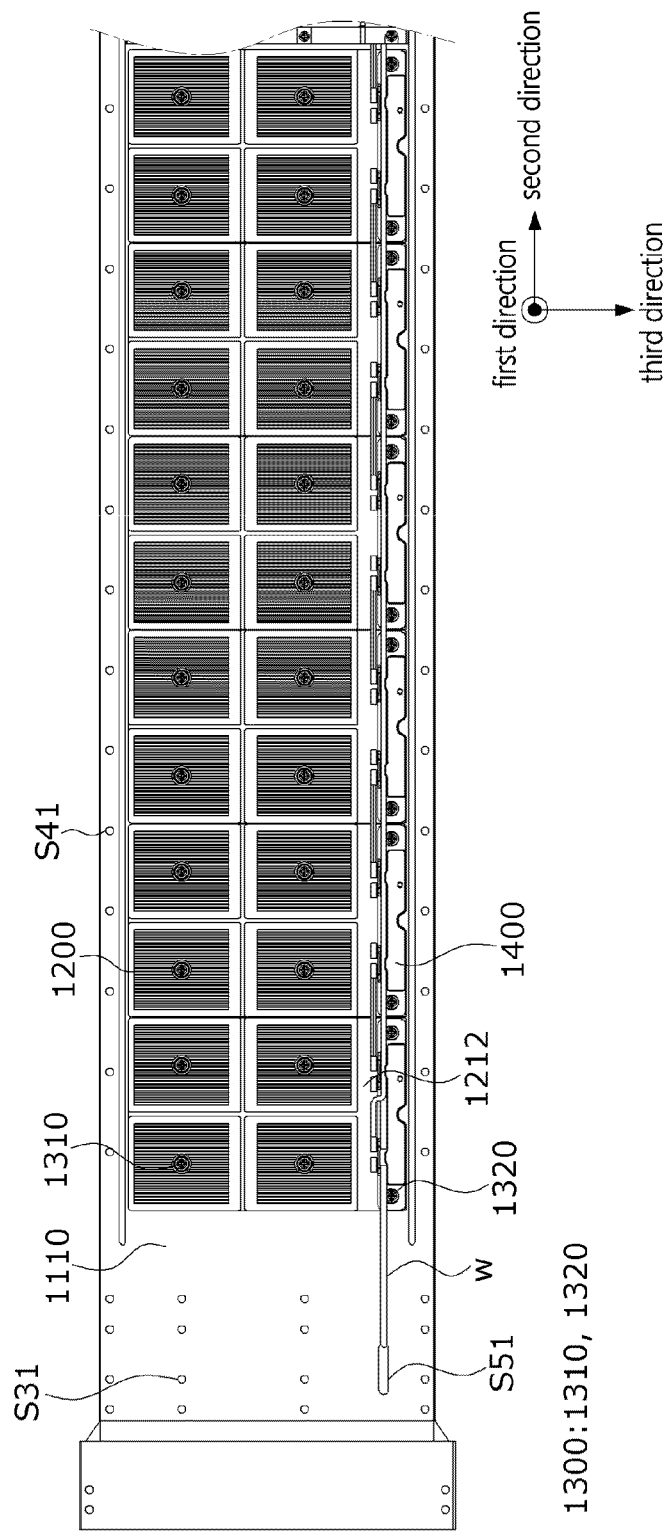
FIG. 7 is a front view of the plurality of thermoelectric modules and a plurality of support members disposed on the one surface of the fluid flow part included in the thermoelectric device according to one embodiment of the present invention.
Figure 8:
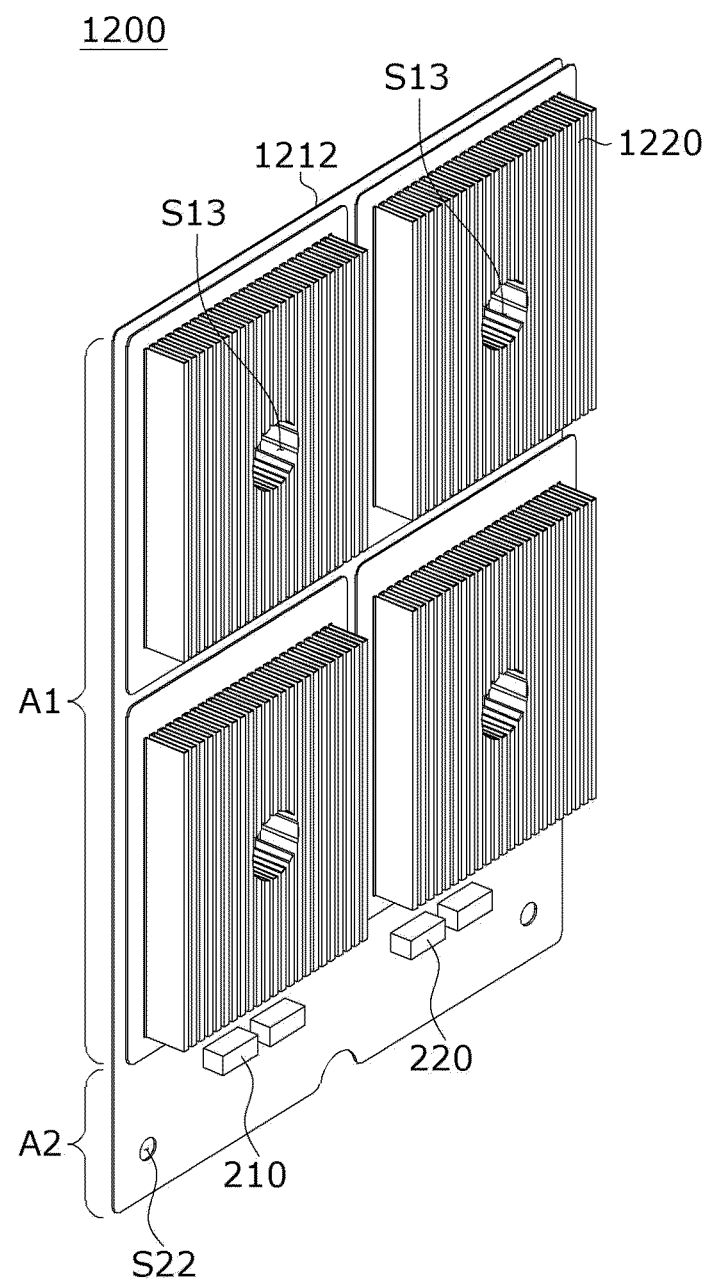
FIG. 8 is a perspective view of the thermoelectric module included in the thermoelectric device according to one embodiment of the present invention.
Figure 9:
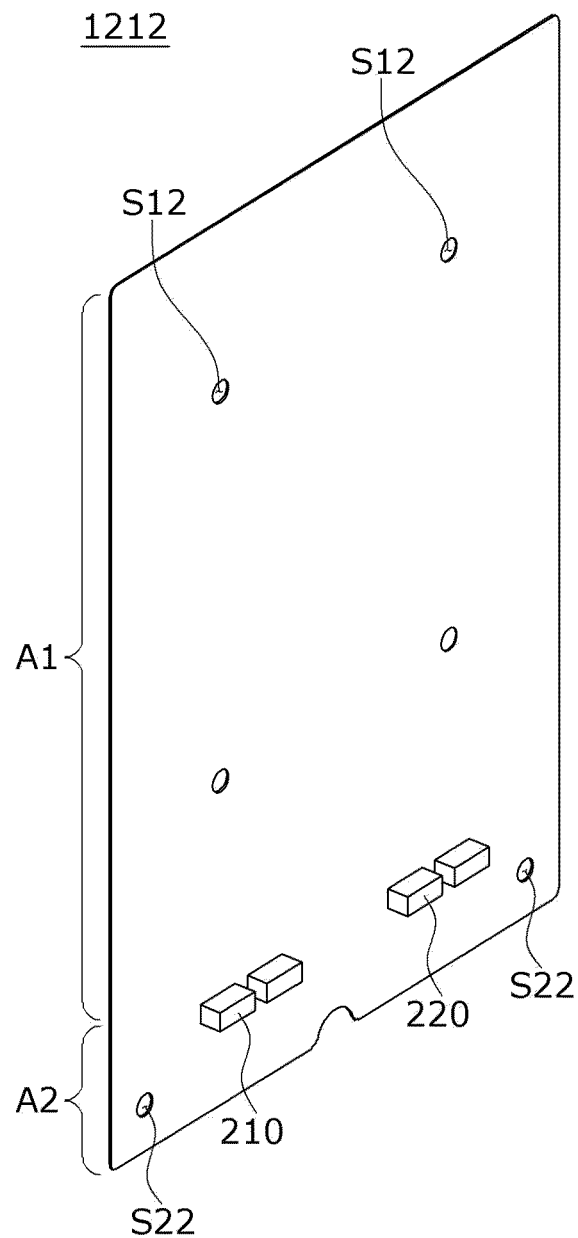
FIG. 9 is a perspective view of a first substrate of the thermoelectric module included in the thermoelectric device according to one embodiment of the present invention.
Figure 10:
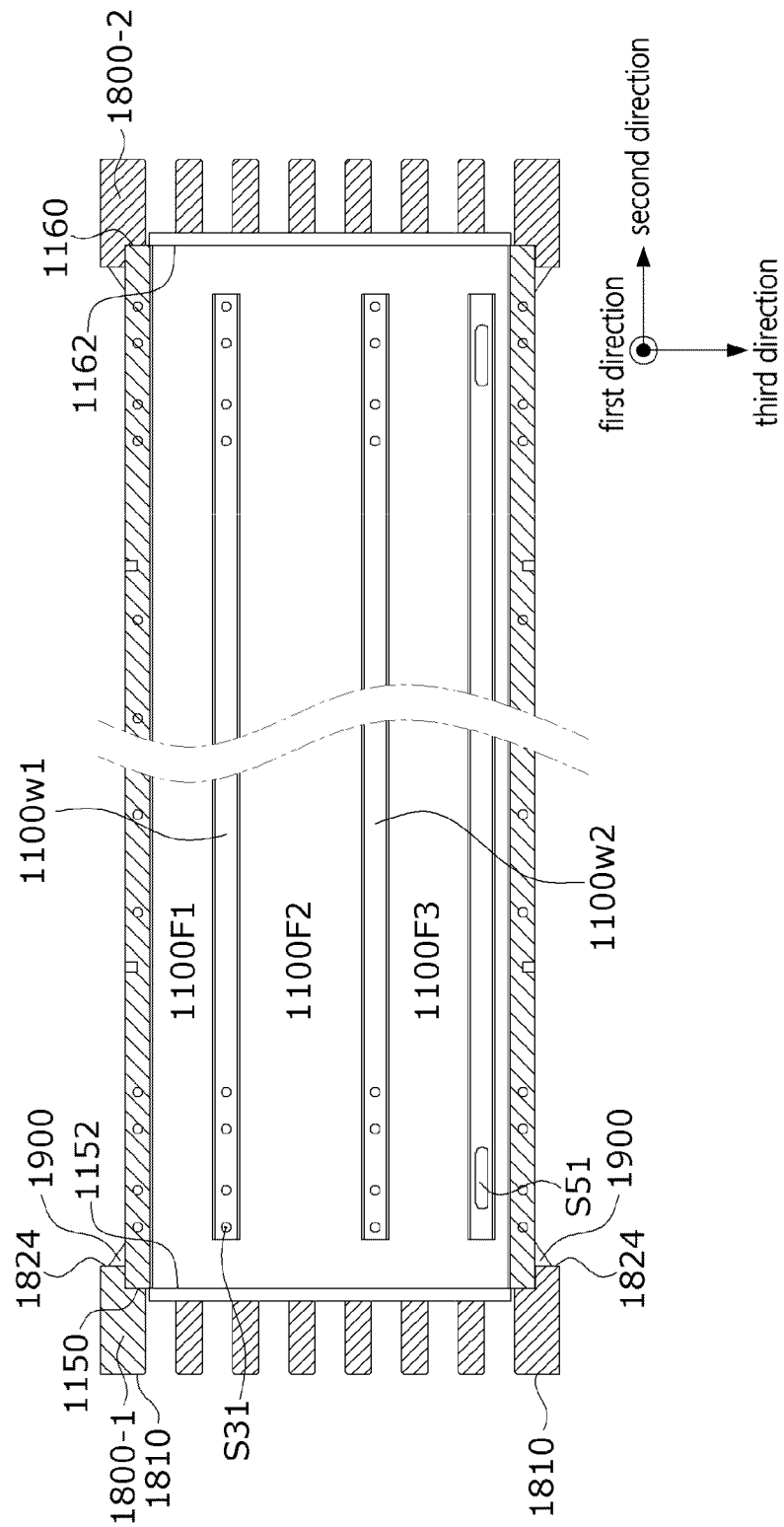
FIG. 10 is a cross-sectional view of the fluid flow part along line A-A' illustrated in FIG. 5.
Figure 11A:
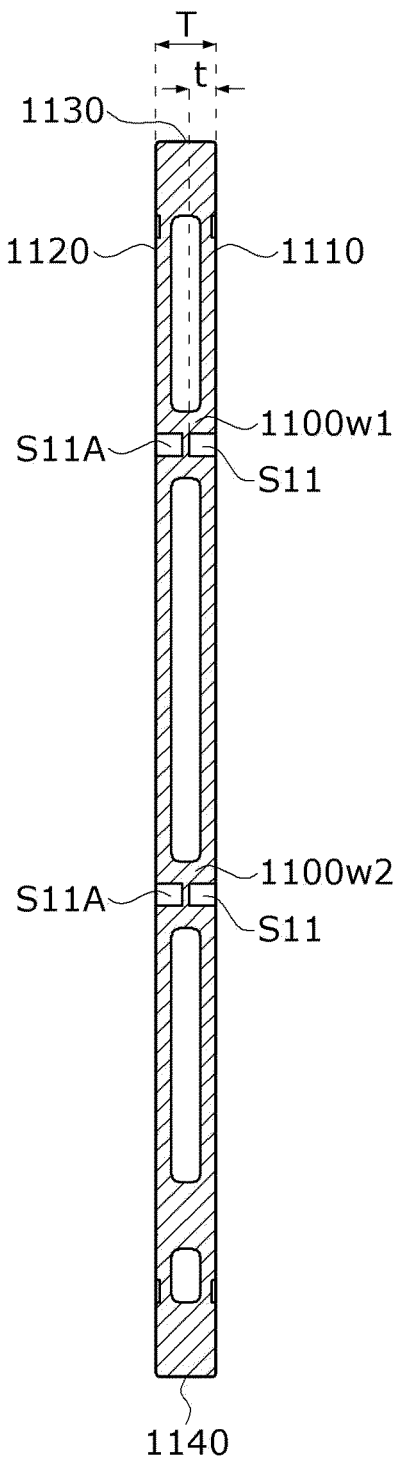
FIG. 11A is a cross-sectional view of the fluid flow part along line B-B' illustrated in FIG. 5.
Figure 11B:
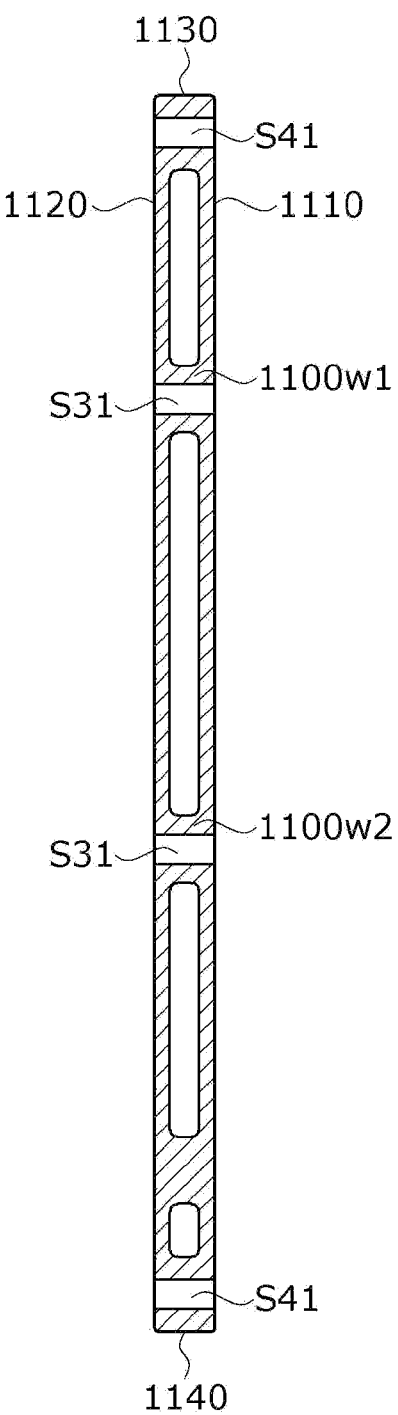
FIG. 11B is a cross-sectional view of the fluid flow part along line C-C' illustrated in FIG. 5.
Figure 12:
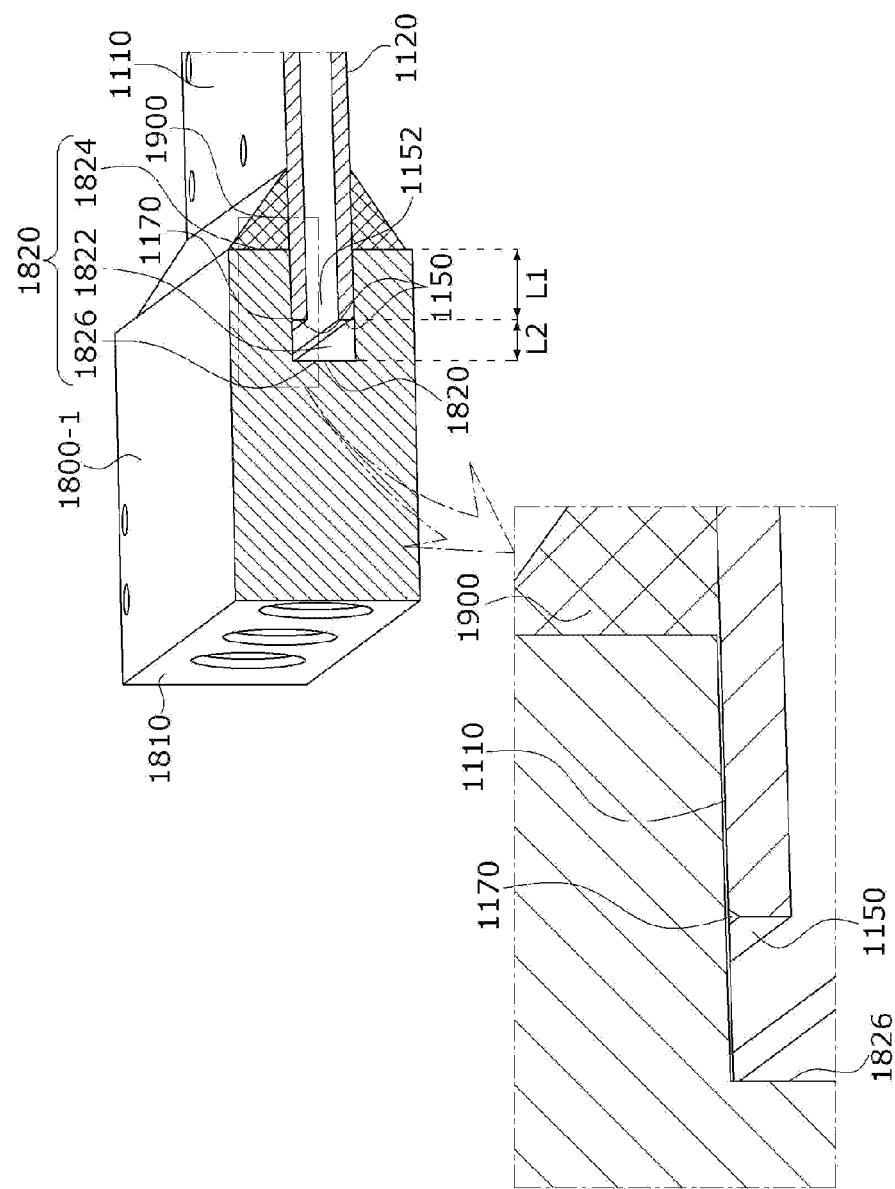
FIGS. 12 and 13 are cross-sectional views of the fluid flow part illustrated in FIG. 5 and a connecting member.
Figure 13:
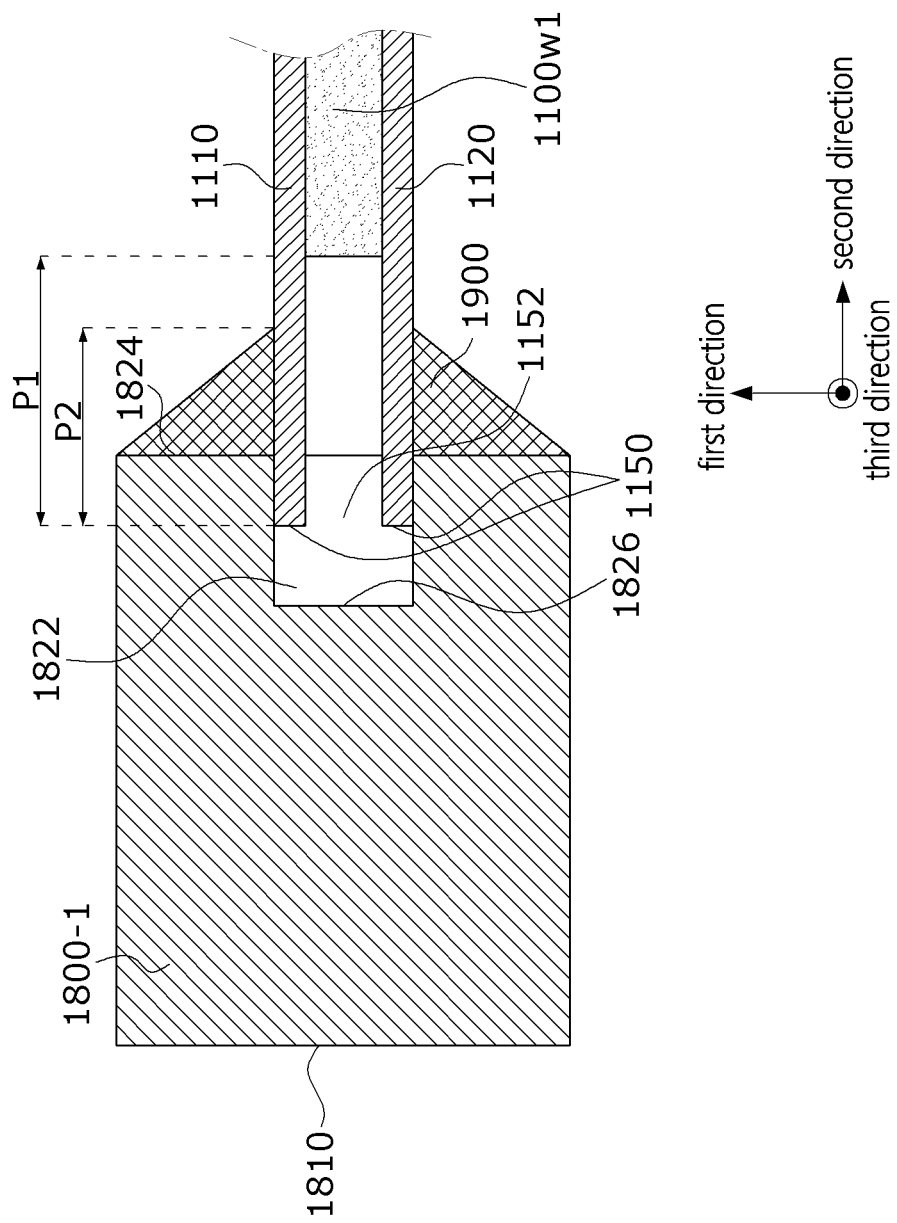

FIG. 5 is a perspective view of one surface of a fluid flow part included in the thermoelectric device according to one embodiment of the present invention, FIG. 6 is a front view of a plurality of thermoelectric modules disposed on the one surface of the fluid flow part included in the thermoelectric device according to one embodiment of the present invention, FIG. 7 is a front view of the plurality of thermoelectric modules and a plurality of support members disposed on the one surface of the fluid flow part included in the thermoelectric device according to one embodiment of the present invention, FIG. 8 is a perspective view of the thermoelectric module included in the thermoelectric device according to one embodiment of the present invention, FIG. 9 is a perspective view of a first substrate of the thermoelectric module included in the thermoelectric device according to one embodiment of the present invention, FIG. 10 is a cross-sectional view of the fluid flow part along line A-A' illustrated in FIG. 5, FIG. 11A is a cross-sectional view of the fluid flow part along line B-B' illustrated in FIG. 5, FIG. 11B is a cross-sectional view of the fluid flow part along line C-C' illustrated in FIG. 5, and FIGS. 12 and 13 are cross-sectional views of the fluid flow part illustrated in FIG. 5 and a connecting member.

Referring to FIGS. 5 to 9, the thermoelectric module 1200 is disposed on the first surface 1100 of the fluid flow part 1100. Hereinafter, for convenience of description, only the thermoelectric module 1200 disposed on the first surface 1110 of the fluid flow part 1100 is described, but the present invention is not limited thereto, and the same structure may be applied to the second surface 1120, which is a surface facing the first surface 1110. With regard to the fluid flow part 1100 and the thermoelectric module 1200, overlapping descriptions of the same contents as those described with reference to FIGS. 1 to 4 will be omitted.

According to the embodiment of the present invention, a first substrate 1212 of the thermoelectric module 1200 is disposed on the first surface 1110 of the fluid flow part 1100. In this case, the first substrate 1212 may be disposed in direct contact with the first surface 1110 of the fluid flow part 1100 or disposed in indirect contact therewith through the TIM or the like. The first substrate 1212 may be the first substrate 110 described with reference to FIGS. 1 to 4. Therefore, with regard to the first substrate 1212, overlapping descriptions of the same contents as the first substrate 110 described with reference to FIGS. 1 to 4 will be omitted.

As illustrated in FIGS. 8 and 9, the first substrate 1212 of the thermoelectric module 1200 may include a first area A1 and a second area A2. In this case, a plurality of first electrodes, a plurality of thermoelectric legs, a plurality of second electrodes, a second substrate, and a heat sink 1220 may be disposed in the first area A1, and connector parts 210 and 220 connected to the first electrode may be disposed in the second area A2, which is one side of the first area A1. Here, the plurality of first electrodes, the plurality of thermoelectric legs, the plurality of second electrodes, and the second substrate may be the plurality of first electrodes 120, the plurality of thermoelectric legs 130 and 140, the plurality of second electrodes 150, and the second substrate 160 described with reference to FIGS. 1 to 4. In FIG. 8, an example in which the second substrate and the heat sink 1220 are divided into four portions is illustrated, but the present invention is not limited thereto. One second substrate and one heat sink 1220 may be disposed for one first substrate, or the second substrate and the heat sink 1220 may be divided into two or more for one first substrate.

According to the embodiment of the present invention, as illustrated in FIGS. 6 and 7, the fluid flow part 1100 and the thermoelectric module 1200 may be coupled by a coupling member 1300. To this end, as illustrated in FIG. 5, a first groove S11 formed to overlap the first substrate 1212 of the thermoelectric module 1200 in the first direction, that is, a direction from the first surface 1110 to the second surface 1120 may be formed in the first surface 1110 of the fluid flow part 1100, and as illustrated in FIG. 9, a through hole S12 corresponding to the first groove S11 may be formed in the first area A1 of the first substrate 1212 of the thermoelectric module 1200. In addition, as illustrated in FIG. 8, a through hole S13 corresponding to the first groove S11 and the through hole S12 may also be formed in the second substrate (not illustrated) and the heat sink 1220 of the thermoelectric module 1200. Therefore, as illustrated in FIGS. 6 and 7, a first coupling member 1310 is coupled to the first groove S11, the through hole S12, and the through hole S13, and thus the fluid flow part 1100 and the thermoelectric module 1200 may be coupled.

Meanwhile, according to the embodiment of the present invention, a second groove S21 may be further formed in the first surface 1110 of the fluid flow part 1100, and a through hole S22 corresponding to the second groove S21 may be further formed in the second area A2 of the first substrate 1212 of the thermoelectric module 1200. In addition, the support member 1400 may be disposed in the second area A2 of the first substrate 1212 (see FIG. 7), and the support member 1400, the through hole S22 of the first substrate 1212, and the second groove S21 of the fluid flow part 1100 may be coupled by a second coupling member 1320.

Therefore, since not only the first area A1 but also the second area A2 of the first substrate 1212 of the thermoelectric module 1200 may be coupled to the fluid flow part 1100, the entirety of the first substrate 1212 of the thermoelectric module 1200 may have uniform bonding strength with the fluid flow part 1100, and heat may be uniformly distributed to the entirety of the first substrate 1212. In particular, when the first substrate 1212 of the thermoelectric module 1200 and the fluid flow part 1100 are coupled using the support member 1400, it is possible to increase a fastening torque of the second coupling member 1320 due to the application of the support member 1400. Therefore, since there is a low possibility that the second coupling member 1320 becomes loose even under a vibration condition, the thermoelectric module 1200 may be more firmly attached to the fluid flow part 1100.

Meanwhile, referring to FIG. 5, the fluid flow part 1100 may have a fluid inlet 1152 of the fluid flow part 1100 disposed in one side surface 1150 between the first surface 1110 and the second surface 1120 and a fluid outlet of the fluid flow part 1100 disposed in the other side surface between the first surface 1110 and the second surface 1120.

Referring to FIG. 10, a plurality of flow paths 1100F1, 1100F2, and 1100F3 extending in the second direction from the one side surface 1150 to the other side surface 1160 of the fluid flow part 1100 may be formed, and flow path partition walls 1100W1 and 1100W2 for partitioning the plurality of flow paths 1100F1, 1100F2, and 1100F3 may be disposed between the plurality of flow paths 1100F1, 1100F2, and 1100F3.

When the plurality of flow paths 1100F1, 1100F2, and 1100F3 are formed in the fluid flow part 1100, the first fluid flowing into the fluid flow part 1100 may be uniformly distributed in the plurality of flow paths 1100F1, 1100F2, and 1100F3, thereby obtaining uniform thermoelectric performance in the thermoelectric module 1200.

Meanwhile, referring to FIG. 11A, the first groove S11 may be formed in the flow path partition walls 1100W1 and 1100W2. Therefore, it is possible to prevent a problem of the first fluid flowing into the fluid flow part 1100 leaking to the outside through the first groove S11.

In this case, a depth t of the first groove S11 may be smaller than a distance T between the first surface 1110 and the second surface 1120 of the fluid flow part 1100. Therefore, since the first groove S11 does not pass through the fluid flow part 1100 from the first surface 1110 to the second surface 1120 of the fluid flow part 1100, it is possible to prevent a problem of the TIM applied between the first surface 1110 of the fluid flow part 1100 and the first substrate 1212 of the thermoelectric module 1200 flowing into the second surface 1120 and prevent a problem that the bonding performance of the thermoelectric module 1200 is degraded on the second surface 1120 due to the TIM applied to the first surface 1110. Here, the TIM is a material with thermal transfer performance and bonding performance and may be referred to as thermal grease, thermal paste, thermal compound, or the like. The TIM may, for example, be in the form of at least one of aluminum oxide, single crystal diamond, and metal particles distributed in silicone oil.

The depth t of the first groove S11 may be smaller than ½ times the distance T between the first surface 1110 and the second surface 1120 of the fluid flow part 1100. Therefore, a groove S11A is also formed at a position symmetrical to the first groove S11 on the second surface 1120 of the fluid flow part 1100, and the thermoelectric module may be fastened.

Meanwhile, referring back to FIGS. 5 to 7 and 10, according to the embodiment of the present invention, holes S31 and S41 may be formed in the first surface 1110 of the fluid flow part 1100 not to overlap the thermoelectric module 1200. The holes S31 and S41 may be formed to pass through the fluid flow part 1100 from the first surface 1110 to the second surface 1120 of the fluid flow part 1100. The holes S31 and S41 may be holes through which the guide member 1700 or the shield member 1500 is fastened. For example, the hole S31 through which the guide member 1700 is fastened may be disposed on the flow path partition walls 1100W1 and 1100W2 of the fluid flow part 1100. As illustrated in FIG. 11B, the hole S31 through which the guide member 1700 is fastened may be formed to pass through the flow path partition walls 1100W1 and 1100W2 of the fluid flow part 1100. According to the embodiment of the present invention, the TIM may be disposed between the fluid flow part 1100 and the thermoelectric module 1200 in order to maximize the thermal transfer performance between the fluid flow part 1100 and the thermoelectric module 1200. In contrast, the guide member 1700 or the shield member 1500 may be disposed on the fluid flow part 1100 without the TIM and then fastened using the coupling member. Therefore, the holes S31 and S41 through which the guide member 1700 or the shield member 1500 is fastened may be formed to pass through the first surface 1110 and the second surface 1120 of the fluid flow part 1100.

According to the embodiment of the present invention, a hole S51 may be further formed in the first surface 1110 of the fluid flow part 1100 so as not to overlap the thermoelectric module 1200. The hole S51 may be formed to pass through the fluid flow part 1100 from the first surface 1110 to the second surface 1120 of the fluid flow part 1100 and may be a hole through which a wire W connected to the thermoelectric module 1200 passes. To this end, the hole S51 may have a greater area than the other holes S31 and S41. Therefore, the wire W connected to the thermoelectric module 1200 of the first surface 1110 may be electrically connected to the thermoelectric module of the second surface 1120 through the through hole S51.

Meanwhile, referring to FIGS. 10, 12, and 13, a first connecting member 1800-1 may be disposed at the one side surface 1150 side of the fluid flow part 1100, and a second connecting member 1800-2 may be disposed at the other side surface 1160 side of the fluid flow part 1100. The first connecting member 1800-1 may function to transfer a fluid of a fluid supply part (not illustrated) to the fluid inlet 1152 of the fluid flow part 1100, and the second connecting member 1800-2 may function to transfer a fluid of the fluid outlet of the fluid flow part 1100 to a fluid recovery part (not illustrated).

To this end, the one side surface 1150 of the fluid flow part 1100 may be disposed to be accommodated in the first connecting member 1800-1, and the other side surface 1160 may be disposed to be accommodated in the second connecting member 1800-2.

The first connecting member 1800-1 may include a surface 1810 disposed to face the fluid supply part (not illustrated) and a surface 1820 disposed to face the surface 1810. The surface 1820 may include a first connecting hole 1822 disposed to face the other side surface 1160 of the fluid flow part 1100 and a first connecting surface 1824 disposed at an edge of the first connecting hole 1822. Likewise, the second connecting member 1800-2 may include a second connecting hole disposed to face the one side surface 1150 of the fluid flow part 1100 and a second connecting surface disposed at an edge of the second connecting hole.

According to the embodiment of the present invention, the one side surface 1150 of the fluid flow part 1100 may be inserted into the first connecting hole 1822, and the other side surface 1160 of the fluid flow part 1100 may be inserted into the second connecting hole. Here, a length L1 of the first connecting member 1800-1 and the fluid flow part 1100 overlapping each other in the first connecting hole 1822 may be 9 mm or more. As described above, when the one side surface 1150 of the fluid flow part 1100 is accommodated in the first connecting member 1800-1, the first connecting member 1800-1 and the fluid flow part 1100 may be fixed stably.

In this case, an inclined surface 1170 may be disposed between the fifth surface 1150 and the first surface 1110, the second surface 1120, the third surface 1130, and the fourth surface 1140 of the fluid flow part 1100. Therefore, the fifth surface 1150 of the fluid flow part 1100 may be easily inserted into the first connecting hole 1822 of the first connecting member 1800-1.

According to the embodiment of the present invention, the fifth surface 1150 of the fluid flow part 1100 may be disposed to be spaced apart from a side surface 1826 of the first connecting hole 1822 of the first connecting member 1800-1. For example, a separation distance L2 between the fifth surface 1150 of the fluid flow part 1100 and the side surface 1826 of the first connecting hole 1822 of the first connecting member 1800-1 may be in a range of 3 to 7 mm and preferably, 4 to 6 mm. Therefore, the fluid discharged from the side surface 1826 of the first connecting hole 1822 of the first connecting member 1800-1 may be distributed after being uniformly mixed before flowing into the fluid flow part 1100, and uniform thermoelectric performance may be provided in all areas of the thermoelectric module 1200.

According to the embodiment of the present invention, after the fifth surface 1150 side of the fluid flow part 1100 is accommodated in the first connecting hole 1822 of the first connecting member 1800-1, the fluid flow part 1100 and the first connecting member 1800-1 may be welded. Therefore, a welding part 1900 may be disposed along a boundary between the first connecting surface 1824 of the first connecting member 1800-1 and the fluid flow part 1100. For example, the welding part 1900 may be formed along a boundary between the first connecting surface 1824 and the first surface 1110, the second surface 1120, the third surface 1130, and the fourth surface 1140 of the fluid flow part 1100. Therefore, it is possible to prevent a problem of the fluid flowing into the fluid flow part 1100 leaking through the first connecting member 1800-1.

Meanwhile, as described above, the flow path partition walls 1100W1 and 1100W2 for partitioning the plurality of flow paths 1100F1, 1100F2, and 1100F3 may be formed inside the fluid flow part 1100. According to the embodiment of the present invention, the flow path partition walls 1100W1 and 1100W2 may extend from a point spaced a predetermined distance from the fifth surface 1150 on which the fluid inlet 1152 is disposed toward the sixth surface 1160. Therefore, the fluid discharged from the side surface 1826 of the first connecting hole 1822 of the first connecting member 00 may be distributed after being uniformly mixed before flowing into the plurality of flow paths 1100F1, 1100F2, and 1100F3 inside the fluid flow part 1100, and uniform thermoelectric performance may be provided in all areas of the thermoelectric module 1200.

In this case, the welding part 1900 and the flow path partition walls 1100W1 and 1100W2 may be disposed not to overlap each other in the first direction. For example, a shortest distance P1 between the fifth surface 1150 and the flow path partition walls 1100W1 and 1100W2 in the fluid flow part 1100 may be greater than a longest distance P2 between the fifth surface 1150 of the fluid flow part 1100 and the welding part 1900. When the flow path partition walls 1100W1 and 1100W2 are formed inside the fluid flow part 1100, the first surface 1110 and the second surface 1120 of the fluid flow part 1100 may be finely curved along the flow path partition walls 1100W1 and 1100W2. When the welding part 1900 is formed not to overlap the flow path partition walls 1100W1 and 1100W2 according to the embodiment of the present invention, it is possible to improve the uniformity and quality of the welding.

The power generation system may generate power through heat sources generated from vessels, vehicles, power plants, geothermal heat, or the like and include a plurality of power generation devices arranged to efficiently converge the heat sources. In this case, in each power generation device, it is possible to improve the cooling performance of the low-temperature part of the thermoelectric element by improving the bonding strength between the thermoelectric module and the fluid flow part, thereby improving the efficiency and reliability of the power generation device and thus improving the fuel efficiency of the transportation such as vessels or vehicles. Therefore, in the shipping and transportation industry, it is possible to reduce transportation costs, create an eco-friendly industry environment, and reduce material costs and the like when applied to a manufacturing industry such as a steel mill.

Although the present invention has been described above with reference to exemplary embodiments, those skilled in the art will understand that the present invention may be modified and changed variously without departing from the spirit and scope of the present invention as described in the appended claims.

The invention claimed is:

1. A thermoelectric device comprising:
a fluid flow part including one surface and the other surface spaced apart from the one surface in a first direction;
a first thermoelectric element disposed on the one surface of the fluid flow part; and
a second thermoelectric element disposed on the other surface of the fluid flow part,
wherein a first groove overlapping the first thermoelectric element in the first direction and a first hole not overlapping the first thermoelectric element in the first direction are disposed in the one surface of the fluid flow part,
a depth of the first groove is smaller than a distance between the one surface and the other surface, and
the first hole passes through the fluid flow part from the one surface to the other surface.

2. The thermoelectric device of claim 1, wherein the first thermoelectric element and the fluid flow part are fixed by a first coupling member disposed in the first thermoelectric element and the first groove.

3. The thermoelectric device of claim 2, wherein a fluid inlet of the fluid flow part is disposed in one side surface between the one surface and the other surface, and a fluid outlet of the fluid flow part is disposed in the other side surface facing the one side surface between the one surface and the other surface,
the fluid flow part includes a plurality of flow paths extending in a second direction from the one side surface to the other side surface,
a flow path partition wall configured to partition the plurality of flow paths is disposed between the plurality of flow paths, and
the first groove is disposed in the flow path partition wall.

4. The thermoelectric device of claim 3, wherein the flow path partition wall extends from a point spaced a predetermined distance from the one side surface toward the other side surface.

5. The thermoelectric device of claim 4, further comprising a first connecting member disposed at the one side surface of the fluid flow part and configured to transfer a fluid to the fluid inlet, and a second connecting member which is disposed at the other side surface of the fluid flow part and through which the fluid discharged from the fluid outlet passes.

6. The thermoelectric device of claim 5, wherein the one side surface is disposed to be accommodated in the first connecting member, and the other side surface is disposed to be accommodated in the second connecting member.

7. The thermoelectric device of claim 6, wherein the first connecting member includes a first connecting hole disposed to face the other side surface of the fluid flow part, and a first connecting surface disposed at an edge of the first connecting hole, and the second connecting member includes a second connecting hole disposed to face the one side surface of the fluid flow part, and a second connecting surface disposed at an edge of the second connecting hole, and
the one side surface of the fluid flow part is inserted into the first connecting hole, and the other side surface of the fluid flow part is inserted into the second connecting hole.

8. The thermoelectric device of claim 7, wherein the first connecting member and the second connecting member are each welded to the fluid flow part.

9. The thermoelectric device of claim 8, wherein a first welding part is disposed along a boundary between the first connecting surface and the fluid flow part, and a second welding part is disposed along a boundary between the second connecting surface and the fluid flow part.

10. The thermoelectric device of claim 9, wherein a shortest distance between the one side surface of the fluid flow part and the flow path partition wall is greater than a longest distance between the one side surface of the fluid flow part and the first welding part.

11. The thermoelectric device of claim 3, wherein an inclined surface is disposed between the one side surface and the one surface of the fluid flow part and between the one side surface and the other surface of the fluid flow part.

12. The thermoelectric device of claim 1, wherein a second groove overlapping the second thermoelectric element in the first direction is disposed on the other surface of the fluid flow part, and a depth of the second groove is smaller than a distance between the one surface and the other surface.

13. The thermoelectric device of claim 12, wherein a depth of each of the first groove and the second groove is smaller than ½ times the distance between the one surface and the other surface.

14. The thermoelectric device of claim 12, wherein the first groove and the second groove is formed at a position which corresponds to each other.

15. The thermoelectric device of claim 1, further comprising: a shield member disposed on a surface of the fluid flow part,
wherein the shield member and the fluid flow part are fixed by a second coupling member disposed on the shield member and the first hole.

16. The thermoelectric device of claim 1, a second hole not overlapping the first thermoelectric element in the first direction is further disposed in the one surface of the fluid flow part, the second hole passes through the fluid flow part from the one surface to the other surface, and a size of the second hole is greater than a size of the first hole.

17. The thermoelectric device of claim 16, wherein a wire connected to at least one of the first thermoelectric element and the second thermoelectric element passes through the second hole.

18. The thermoelectric device of claim 1, further comprising a first heat sink disposed on the first thermoelectric element, and a second heat sink disposed on the second thermoelectric element.

19. The thermoelectric device of claim 1, further comprising a thermal interface material disposed between the one surface of the fluid flow part and the first thermoelectric element.

20. The thermoelectric device of claim 9, wherein the first welding part and the flow path partition wall do not overlap each other in the first direction.

* * * * *